United States Patent [19]
Baschirotto et al.

[11] Patent Number: 5,994,960
[45] Date of Patent: Nov. 30, 1999

[54] HIGH SPEED SWITCHED OP-AMP FOR LOW SUPPLY VOLTAGE APPLICATIONS

[75] Inventors: Andrea Baschirotto, Tortona; Angelo Nagari, Cilavegna; Rinaldo Castello, Arcore, all of Italy

[73] Assignee: SGS-Thomson Microelectronics S.r.l., Agrate Brianza, Italy

[21] Appl. No.: 08/948,562

[22] Filed: Oct. 10, 1997

[30] Foreign Application Priority Data

Oct. 11, 1996 [EP] European Pat. Off. .............. 96830524

[51] Int. Cl.[6] ................................. H03F 3/45; H03F 1/14
[52] U.S. Cl. ............................................. 330/253; 330/292
[58] Field of Search ............................ 330/51, 252, 253, 330/255, 292

[56] References Cited

U.S. PATENT DOCUMENTS

| 5,412,344 | 5/1995 | Franck | 330/292 X |
| 5,477,190 | 12/1995 | Brehmer et al. | 330/253 |
| 5,805,021 | 9/1998 | Brehmer | 330/253 |

FOREIGN PATENT DOCUMENTS

| 0695106 A1 | 1/1996 | European Pat. Off. | H04R 3/00 |
| 3119516 A1 | 2/1982 | Germany | H03F 3/45 |
| 3725323 A1 | 11/1988 | Germany | H03F 3/45 |
| WO 84/04421 | 11/1984 | WIPO | G11C 27/02 |

*Primary Examiner*—Steven J. Mottola
*Attorney, Agent, or Firm*—Allen, Dyer, Doppelt, Milbrath & Gilchrist, P.A.

[57] ABSTRACT

In a switched operational amplifier including a differential input stage and at least a second output stage, the compensation capacitor commonly required to couple the output node of the second stage with the respective output node of the input differential stage of the amplifier is associated with a switching circuit. The switching circuit is controlled by the same control phase that enables/disables the amplifier for interrupting the connection between the compensation capacitor (CC) and the output node of the differential input stage during a phase in which the amplifier is disabled for reducing the switch-on time. Notably the differential input stage of the operational amplifier remains always active and only the second output stage is switched on and off.

13 Claims, 2 Drawing Sheets

5,994,960

HIGH SPEED SWITCHED OP-AMP FOR LOW SUPPLY VOLTAGE APPLICATIONS

FIELD OF THE INVENTION

The present invention relates to switched-capacitor (SC) circuits, and, more particularly, to low voltage supply and low power consumption applications using a so-called switched op-amp for providing a high conductance input switch under any signal condition.

BACKGROUND OF THE INVENTION

Switched-capacitor circuits are widely used for signal processing because of their low distortion and simple integration. Filters of many types may be realized with switched-capacitor circuits. In battery operated integrated circuits, for example, in general when operating at low voltage supply and at low power consumption, there exists the need for the circuits to function at particularly low voltages, such as down to about 1.5 V. Under these conditions it is difficult to efficiently drive the switches, which are commonly provided by field effect (FET) transistors, usually MOSFETs. Indeed, when the power supply is lowered down to levels comparable to those of the threshold voltage of the devices, the classical switched-capacitor structures as shown in FIG. 1, for example, may lose their efficiency rapidly.

To ensure correct functioning of the input switch S1, whose overdrive voltage depends upon the input signal, the operating voltage swing of the circuit should be limited. One proposed solution to this problem that would ensure that the switches, and in particular the input switch S1 see a high conductance under any input signal condition, is based on realizing the switches with low voltage threshold devices. Alternatively, dedicated clock voltage multiplier circuits could be integrated in the device (voltage boosters), with which the switches may then be overdriven. This second approach, while overcoming the problem of having to diversify the manufacturing process to realize low threshold devices, requires the integration of dedicated voltage boosters.

An alternative approach is based on the use of a switching structure called the "Switched Op-Amp" represented by an operational amplifier, as is disclosed in the article: "Switched-Opamp, an approach to Realize Full CMOS Switched-Capacitor Circuits at Very Low Power Supply Voltages" by Jan Crols and Michel Steyaert, Journal of Solid State Circuits, Vol. 25, No. 8, August 1994, pages 936–942. According to this approach, the proposed solution for ensuring a high conductance to the switches under any signal condition, and in particular to the input switch S1, rests upon substituting the MOSFET that is conventionally used as the input switch with a switched op-amp driven ON and OFF through a dedicated switch. The other switches of the switched-capacitor structure may be also realized with single n-channel or p-channel transistors, without necessarily resorting to CMOS structures. FIG. 7 of the above cited article shows the complete topology of a switched op-amp used as a switch to realize a switched-capacitor circuit. The circuit of FIG. 7 of the above mentioned article is herein reproduced as FIG. 2.

The switched op-amp circuit substantially includes two amplifying stages with a compensation capacitor CM according to a classical Miller compensation scheme. Unfortunately, this known amplifier presents a problem concerning the switching time. Being that the circuit is primarily destined for switched-capacitor circuits, where switched op-amps replace those simple switches that may provide critical elements in low voltage supply applications, the output node of the op-amp is driven to the supply voltage during a switching phase to thereby avoid the use of a critical switch along the signal path. Of course, its switching speed represents a fundamental limiting performance parameter.

In the illustrated circuit of FIG. 2, the switching time is strongly limited by the Miller capacitor CM. In fact, during a first switching phase Ph1 when the switched op-amp is OFF, the output node Vop is coupled to a very low reference voltage (or to ground) and therefore so is the plate of the compensation capacitor CM. The potential of the other plate of the capacitor CM also shifts because the first stage of the amplifier is OFF. This situation is reflected in an increased switch-on time because of the charge recovering time on the compensation capacitor CM.

SUMMARY OF THE INVENTION

In view of the foregoing background, it is therefore an object of the present invention to reduce the switch-on time of the op-amp circuit.

This is achieved, according to the present invention, by modifying the compensation scheme in a way so that only the second stage of the amplifier is disabled during the relative switching phase.

According to a first important aspect of the invention, the compensation network includes a capacitor coupled through a switch to the respective output node of the first stage of the amplifier and to a folded-cascode stage coupled to the control terminal of a pull-down transistor which, in turn, comprises two transistors. The switch linking the compensation capacitor to the folded-cascode stage may be driven by the minimum supply voltage necessary to ensure a proper op-amp performance, for example, with a voltage equivalent to VTH+ 2Vov (where VTH represents the threshold voltage of the switch.) In this way the compensation capacitor keeps its charge even during the OFF phase of the op-amp eliminating the need for a charge recovering time at the op-amp turn-on instant.

According to another aspect of the invention, the op-amp circuit is not completely disabled during the OFF phase but instead only the output stage is turned off, while the input stage is kept active. This further increases the switching speed which is limited only by the electrical characteristics of the CMOS output pair.

BRIEF DESCRIPTION OF THE DRAWINGS

The different aspects and advantages of the invention will become more evident through the following description of an important embodiment and by referring to the attached drawings, wherein.

DETAILED DESCRIPTION OF THE PREFERRED EMBODIMENTS

Figure 1:
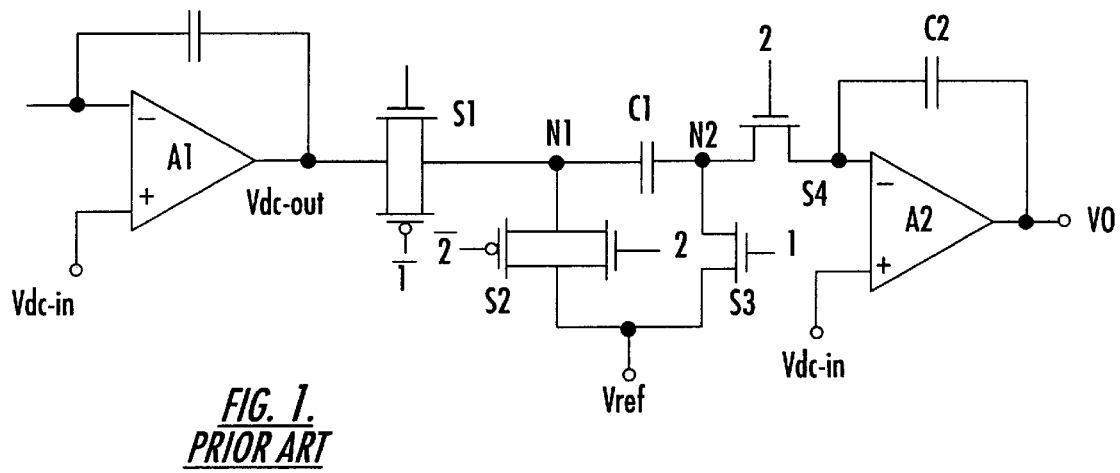
FIG. 1 shows a switched-capacitor circuit, as in the prior art.
Figure 2:
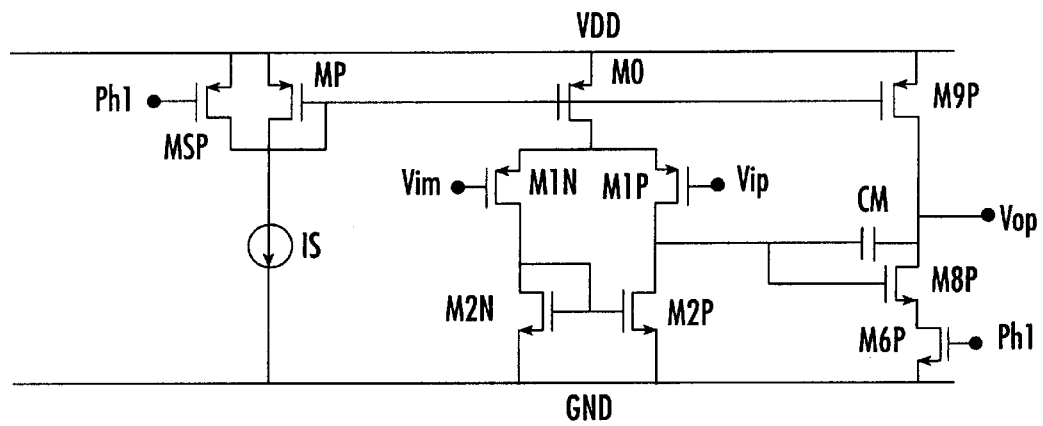
FIG. 2 as above-mentioned, reproduces the complete topology of a switchable op-amp of the prior art.
Figure 3:
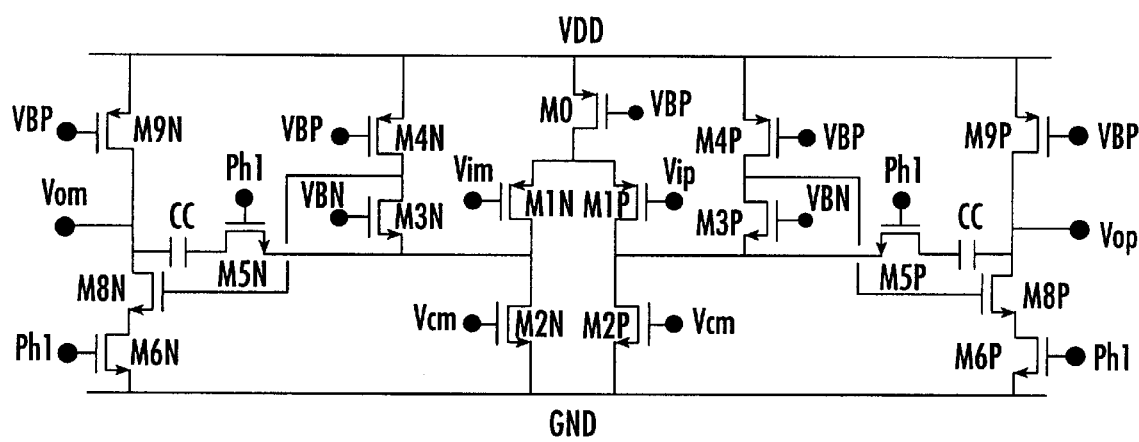
FIG. 3 shows the circuit topology of a switchable op-amp realized according to the invention, by way of example, in a fully differential form.

Purely for illustrative purposes, FIG. 3 depicts an embodiment relative to a fully differential architecture (that is, having a differential output) of a switchable op-amp. It is evident that the invention may also be practiced in a conventional single-ended architecture instead of in a fully differential one. Having established this, the circuit aspects that implement the invention are clearly identifiable upon comparing either of the two branches of the fully differential amplifier of FIG. 3 with a known circuit as reproduced in FIG. 2.

In relation to the Vop output branch, the modified scheme of compensation of the invention is realized by employing a switch, M5P, controlled by the control phase Ph1 which also controls the switch M6P that enables/disables the respective output stage comprising the pair of transistors M9P and M8P, while the folded stage remains ON. In this manner, the compensation capacitor CC, differently from the corresponding Miller compensator CM of the known architecture of FIG. 2, retains its charge during the interval the op-amp is disabled by the control phase Ph1. Moreover, the differential input stage of the op-amp, provided by the M0, M1N, M1P, M2N and M2P devices, is not disabled but remains always active.

The scheme of the invention is duplicated for the other Vom output branch of the switchable op-amp according to the fully differential embodiment depicted in FIG. 3.

Of course, in the case of a fully differential embodiment as that of FIG. 3, it is necessary to implement a control in a common mode by applying a common mode signal, Vcm, to the gate terminals of the two transistors M2N and M2P of the differential input stage of the op-amp. The Vcm signal may be generated by employing any known common mode voltage sensing network coupled to the Vop and Vom outputs nodes of the op-amp suitable for operating at the relatively low supply voltage for which the op-amp is designed.

According to the results of test simulations of the circuit of the invention, an appreciable reduction of the switch-on time of the op-amp as compared to the case of the known architecture of FIG. 2 has been obtained. In practice the circuit of the invention is 15 times faster than the known circuit.

That which is claimed is:

1. A op-amp being switchable responsive to a control signal and comprising:
   a differential input stage having an output;
   a second stage having an output, and having an input connected to the output of said differential input stage, said second stage further comprising at least one pull-down transistor having a control terminal;
   means for enabling and disabling said second stage responsive to the control signal;
   a compensation capacitor coupled between the output of said second stage and the output of said differential input stage;
   at least one switch responsive to the control signal for disconnecting said compensation capacitor from the output of said differential input stage when said second stage is also disabled; and
   a folded-cascode stage coupling the output of said differential input stage to the control terminal of said pull-down transistor of said second stage.

2. An op-amp according to claim 1, wherein the differential input stage has a second output; and further comprising:
   a third stage having an output, and having an input connected to the second output of said differential input stage, said third stage further comprising at least one pull-down transistor having a control terminal;
   second means for enabling and disabling said second stage responsive to the control signal;
   a second compensation capacitor coupled between the output of said third stage and the second output of said differential input stage;
   at least one second switch responsive to the control signal for disconnecting said second compensation capacitor from the second output of said differential input stage when said third stage is also disabled; and
   a second folded-cascode stage coupling the second output of said differential input stage to the control terminal of said pull-down transistor of said third stage.

3. An op-amp according to claim 1 wherein said differential input stage comprises means for permitting said differential input stage to remain active even when said second stage is disabled responsive to the control signal.

4. A op-amp being switchable responsive to a control signal and comprising:
   a differential input stage having an output;
   a second stage having an output, and having an input connected to the output of said differential input stage, said second stage further comprising at least one pull-down transistor having a control terminal;
   means for enabling and disabling said second stage responsive to the control signal and while said differential input stage remains active;
   a compensation capacitor coupled between the output of said second stage and the output of said differential input stage;
   at least one switch responsive to the control signal for disconnecting said compensation capacitor from the output of said differential input stage when said second stage is also disabled; and
   coupling means for coupling the output of said differential input stage to the control terminal of said pull-down transistor of said second stage.

5. An op-amp according to claim 4, wherein said coupling means comprises a folded cascode stage.

6. An op-amp according to claim 4, wherein the differential input stage has a second output; and further comprising:
   a third stage having an output, and having an input connected to the second output of said differential input stage, said third stage further comprising at least one pull-down transistor having a control terminal;
   second means for enabling and disabling said second stage responsive to the control signal and while said differential input stage remains active;
   a second compensation capacitor coupled between the output of said third stage and the second output of said differential input stage;
   at least one second switch responsive to the control signal for disconnecting said second compensation capacitor from the second output of said differential input stage when said third stage is also disabled; and
   second coupling means for coupling the second output of said differential input stage to the control terminal of said pull-down transistor of said third stage.

7. An op-amp according to claim 6, wherein said second coupling means comprises a second folded cascode stage.

8. A op-amp being fully differential and switchable responsive to a control signal and comprising:
   a differential input stage having first and second outputs;
   a second stage having an output, and having an input connected to the first output of said differential input stage, said second stage further comprising at least one pull-down transistor having a control terminal;

first means for enabling and disabling said second stage responsive to the control signal;

a first compensation capacitor coupled between the output of said second stage and the first output of said differential input stage;

at least one first switch responsive to the control signal for disconnecting said first compensation capacitor from the first output of said differential input stage when said second stage is also disabled;

coupling means for coupling the first output of said differential input stage to the control terminal of said pull-down transistor of said second stage;

a third stage having an output, and having an input connected to the second output of said differential input stage, said third stage further comprising at least one pull-down transistor having a control terminal;

second means for enabling and disabling said second stage responsive to the control signal;

a second compensation capacitor coupled between the output of said third stage and the second output of said differential input stage;

at least one second switch responsive to the control signal for disconnecting said second compensation capacitor from the second output of said differential input stage when said third stage is also disabled; and second coupling means for coupling the second output of said differential input stage to the control terminal of said pull-down transistor of said third stage.

9. An op-amp according to claim 8, wherein said first and second coupling means each comprises a folded cascode stage.

10. An op-amp according to claim 8, wherein said differential input stage comprises means for permitting said differential input stage to remain active even when said second stage and third stages are disabled responsive to the control signal.

11. A method for controlling an op-amp responsive to a control signal and comprising the steps of:

providing a differential input stage having an output;

providing a second stage having an output, and having an input connected to the output of said differential input stage, said second stage further comprising at least one pull-down transistor having a control terminal;

enabling and disabling said second stage responsive to the control signal;

providing a compensation capacitor coupled between the output of said second stage and the output of said differential input stage, and disconnecting said compensation capacitor from the output of said differential input stage when said second stage is also disabled; and coupling the output of said differential input stage to the control terminal of said pull-down transistor of said second stage.

12. A method according to claim 11 further comprising the step of maintaining the differential input stage active while said second stage is disabled.

13. A method according to claim 11, wherein the differential input stage has a second output; and further comprising the steps of:

providing a third stage having an output, and having an input connected to the second output of said differential input stage, said third stage further comprising at least one pull-down transistor having a control terminal;

enabling and disabling said third stage responsive to the control signal and while said differential input stage remains active;

providing a second compensation capacitor coupled between the output of said third stage and the second output of said differential input stage;

disconnecting said second compensation capacitor from the second output of said differential input stage when said third stage is also disabled; and coupling the second output of said differential input stage to the control terminal of said pull-down transistor of said third stage.

\* \* \* \* \*